United States Patent
Hajimiri et al.

(10) Patent No.: US 12,046,918 B2
(45) Date of Patent: Jul. 23, 2024

(54) RECOVERY UNITS FOR NON-PROXIMITY WIRELESS POWER TRANSFER

(71) Applicant: GuRu Wireless, Inc., Pasadena, CA (US)

(72) Inventors: Seyed Ali Hajimiri, Pasadena, CA (US); Ahmed Akgiray, Pasadena, CA (US); Florian Bohn, Pasadena, CA (US); Raimond Ghazarian, Pasadena, CA (US)

(73) Assignee: GuRu Wireless, Inc., Pasadena, CA (US)

( * ) Notice: Subject to any disclaimer, the term of this patent is extended or adjusted under 35 U.S.C. 154(b) by 0 days.

(21) Appl. No.: 16/389,673

(22) Filed: Apr. 19, 2019

(65) Prior Publication Data

US 2019/0356172 A1    Nov. 21, 2019

Related U.S. Application Data

(60) Provisional application No. 62/659,996, filed on Apr. 19, 2018.

(51) Int. Cl.
| | |
|---|---|
| *H02J 50/40* | (2016.01) |
| *H02J 7/00* | (2006.01) |
| *H02J 50/10* | (2016.01) |
| *H02J 50/20* | (2016.01) |
| *H02J 50/80* | (2016.01) |
| *G01C 19/56* | (2012.01) |
| *G01P 15/08* | (2006.01) |
| *G01R 33/02* | (2006.01) |
| *H04B 1/3827* | (2015.01) |

(52) U.S. Cl.
CPC ......... *H02J 50/40* (2016.02); *H02J 7/00034* (2020.01); *H02J 50/10* (2016.02); *H02J 50/20* (2016.02); *H02J 50/80* (2016.02); *G01C 19/56* (2013.01); *G01P 15/08* (2013.01); *G01R 33/02* (2013.01); *H04B 1/3827* (2013.01)

(58) Field of Classification Search
CPC .................................. H02J 50/00; H04B 5/00
USPC ....................................................... 307/104
See application file for complete search history.

(56) References Cited

U.S. PATENT DOCUMENTS

| 8,169,185 B2 * | 5/2012 | Partovi | H02J 50/80 |
| | | | 320/108 |
| 10,103,552 B1 * | 10/2018 | Leabman | H02J 50/402 |
| 10,291,055 B1 * | 5/2019 | Bell | H02J 50/27 |

(Continued)

*Primary Examiner* — Adi Amrany
(74) *Attorney, Agent, or Firm* — Weaver Austin Villeneuve & Sampson LLP

(57) ABSTRACT

A recovery unit adapted to receive a mobile device includes a multitude of planar antennas disposed along at least one of bottom or top surfaces of the recovery unit, a rectifying circuit adapted to convert an RF power received by the planar antennas to a DC power, an energy storage unit adapted to store the DC power, and a wireless communication circuit adapted to communicate with a power generating unit generating the RF power. The recovery unit is further adapted to supply the DC power to the mobile device. The recovery unit may further include a multitude of edge antennas disposed along exterior edges of the recovery unit. The recovery unit may further include at least one inductive coil to supply power to the mobile device when an AC power is applied to the inductive coil. The AC power may be generated from the received RF power.

23 Claims, 15 Drawing Sheets

(56) References Cited

U.S. PATENT DOCUMENTS

| | | | |
|---|---|---|---|
| 2011/0050164 A1* | 3/2011 | Partovi | H02J 7/00034 |
| | | | 320/108 |
| 2011/0175461 A1* | 7/2011 | Tinaphong | H02J 50/402 |
| | | | 307/149 |
| 2014/0057686 A1* | 2/2014 | McCaughey | H01Q 19/28 |
| | | | 455/575.5 |
| 2014/0065948 A1* | 3/2014 | Huang | H02J 7/0045 |
| | | | 455/7 |
| 2014/0252866 A1* | 9/2014 | Walsh | H01F 38/14 |
| | | | 307/104 |
| 2015/0245186 A1* | 8/2015 | Park | H04W 4/16 |
| | | | 455/417 |
| 2016/0006293 A1* | 1/2016 | Jeong | H04B 5/0075 |
| | | | 320/108 |
| 2016/0099757 A1* | 4/2016 | Leabman | H02J 50/20 |
| | | | 307/104 |
| 2016/0294225 A1* | 10/2016 | Blum | H02J 7/342 |
| 2016/0372818 A1* | 12/2016 | Nakano | H01Q 1/48 |
| 2017/0026498 A1* | 1/2017 | Goldfain | A45C 15/00 |
| 2017/0080251 A1* | 3/2017 | Yehezkel | A61L 2/26 |
| 2017/0108894 A1* | 4/2017 | Tannous | G06F 1/1628 |
| 2017/0339627 A1* | 11/2017 | Achamola | H04W 48/14 |
| 2018/0198199 A1* | 7/2018 | Hosseini | H02J 50/23 |
| 2018/0338027 A1* | 11/2018 | Sung | H04N 5/2257 |
| 2019/0158136 A1* | 5/2019 | DiLella | H04B 1/3888 |
| 2020/0144837 A1* | 5/2020 | To | H02J 50/005 |
| 2020/0310491 A1* | 10/2020 | Kim | H02J 50/10 |

* cited by examiner

RECOVERY UNITS FOR NON-PROXIMITY WIRELESS POWER TRANSFER

CROSS-REFERENCE TO RELATED APPLICATION

The present application claims benefit under 35 USC 119(e) of U.S. Patent Application No. 62/659,996, filed Apr. 19, 2018, the content of which is incorporated herein by reference in its entirety.

FIELD OF THE INVENTION

The present invention relates to a recovery unit adapted to receive power wirelessly.

BACKGROUND OF THE INVENTION

Long range, non-proximity wireless power transmission through the use of radio frequency (RF) and mm-wave beam forming and focusing enables and enhances a plethora of new applications. For example, the proliferation of internet of things (IoT) devices and sensors can be substantially accelerated by delivering power wirelessly and eliminating extra wiring during installation of such devices. Wireless charging of portable personal devices, such as smart phones and tablets, significantly enhances their usability by reducing the demand on the amount of energy that such devices need to carry.

BRIEF SUMMARY OF THE INVENTION

A recovery unit adapted to receive a mobile device, in accordance with one embodiment of the present invention, includes, in part, a multitude of planar antennas disposed along at least one of bottom or top surfaces of the recovery unit, a rectifying circuit adapted to convert an RF power received by the planar antennas to a DC power, an energy storage unit adapted to store the DC power, and a wireless communication circuit adapted to communicate with a power generating unit generating the RF power. The recovery unit is further adapted to supply the DC power to the mobile device when the mobile device is placed the recovery unit.

In one embodiment, the rectifying circuit is disposed on a board on which the planar antennas are disposed. In one embodiment, the recovery unit further includes, in part, a multitude of edge antennas disposed along exterior edges of the recovery unit. In one embodiment, the planar antennas form an array which may be a two-dimensional array.

In one embodiment, the recovery unit further includes, in part, a lid adapted to swivel around an end axis of the recovery unit thereby to open and close the recovery unit. In one embodiment, the lid includes a multitude of planar antennas positioned along a surface of the lid and that are adapted to receive the RF power. In one embodiment, the lid further includes, in part, another multitude of planar antennas positioned along a second surface of the lid and that are adapted to receive the RF power. In one embodiment, the recovery unit further includes, in part, a multitude of planar antennas disposed along both top and bottom surfaces of the recovery unit.

In one embodiment, the wireless communication circuit further communicates with the mobile device via a wireless or wired link. In one embodiment, the recovery unit further includes, in part, an inertia measurement unit, a magnetometer, and a processor configured to control and process data received from the wireless communication circuit, the inertia measurement unit and the magnetometer.

In one embodiment, the recovery unit further includes, in part, at least one inductive coil adapted to supply or receive power from the mobile device. In one embodiment, the recovery unit is further adapted to supply power to the mobile device when an AC power is applied to the inductive coil. The AC power may be generated from the received RF power. In one embodiment, the recovery unit is further adapted to supply power to the mobile device from the energy storage unit when an AC power is applied to the inductive coil. The AC power may be generated from the received RF power.

In one embodiment, the recovery unit further includes, in part, a display. In one embodiment, the recovery unit further includes, an accelerometer. In one embodiment, the recovery unit further includes, in part a gyroscope. In one embodiment, the recovery unit further includes, in part, a magnetometer.

In one embodiment, the recovery unit further includes, in part, a processor configured to control and process data received from any one of the wireless communication circuit, the accelerometer, the gyroscope and the magnetometer. In one embodiment, the wireless communication circuit is adapted to receive information about inertia and orientation of the mobile device. In one embodiment, the recovery unit further includes, in part, a DC-to-DC converter. In one embodiment, the recovery unit further includes, in part, a voltage regulator. In one embodiment, the recovery unit is adapted to provide information about its orientation to the power generating unit via the wireless communication circuit.

A recovery unit adapted to receive a mobile device, in accordance with one exemplary embodiment of the present invention, includes, in part, a multitude of planar antennas disposed along either top or bottom surfaces of the recovery unit, at least one inductive coil that can inductively supply or receive power from the mobile device, an energy storage unit, and a rectifying circuit adapted to convert an RF power received by the planar antennas so as to supply power to the mobile device or the energy storage unit.

In one embodiment, the recovery unit is adapted to supply power to the mobile device by applying an AC voltage to the inductive coil. The AC voltage may be generated from the received RF power.

In one embodiment, the recovery unit is adapted to supply power to the mobile device from the energy storage unit when an AC power is applied to the inductive coil. Such an AC voltage may be generated from the received RF power. In one embodiment, the recovery unit further includes, in part, a multitude of edge antennas disposed along exterior edges of the recovery unit.

A recovery unit adapted to receive a mobile device, in accordance with one embodiment of the present invention, includes, in part, a multitude of edge antennas disposed along exterior edges of the recovery unit, a multitude of planar antennas disposed along a bottom surface of the recovery unit, and a rectifying circuit adapted to convert an RF power received by the edge and planar antennas to a DC power. The recovery unit is further adapted to supply the DC power to the mobile device when the mobile device is placed in the recovery unit.

In one embodiment, the rectifying circuit is disposed on a board on which the planar antennas are disposed. In one embodiment, the rectifying circuit is disposed in a module that includes a port for communicating with the mobile device. In one embodiment, the planar antennas form an array which may be a two-dimensional array.

In one embodiment, the recovery unit further includes a lid adapted to swivel around an end axis of the recovery unit thereby to open and close the recovery unit. In one embodiment, the lid includes a multitude of planar antennas positioned along a first surface of the lid and that are adapted to receive the RF power. In one embodiment, the lid includes another multitude of antennas positioned along a second surface of the lid and that are adapted to receive the RF power.

In one embodiment, the recovery unit further includes, in part, a second multitude of planar antennas disposed along a top surface of the recovery unit. In one embodiment, the recovery unit further includes a wireless communication circuit adapted to communicate with a power generating unit generating the RF power.

In one embodiment, the recovery unit further includes an inertia measurement unit, a magnetometer; and a processor configured to control and process data received from the wireless communication circuit, the inertia measurement unit and the magnetometer.

In one embodiment, the recovery unit further includes a barometer. In one embodiment, the recovery unit further includes a temperature sensor. In one embodiment, the recovery unit further includes a humidity sensor. In one embodiment, the recovery unit further includes a DC-to-DC converter. In one embodiment, the recovery unit further includes a voltage regulator. In one embodiment, the recovery unit further includes an amplifier. In one embodiment, the recovery unit further includes an energy storage unit.

In one embodiment, the recovery unit is adapted to provide information about elevation, temperature and humidity to the power generating unit via the wireless communication circuit. In one embodiment, the recovery unit is adapted to provide information about its orientation to the power generating unit via the wireless communication circuit. In one embodiment, the recovery unit further includes an inductive coil to charge the mobile device from the received RF power. In one embodiment, the recovery unit further includes a display.

DETAILED DESCRIPTION OF THE INVENTION

A wireless power generation unit (GU) often includes multiple RF sources and transmit antennas. The phase and amplitude of each source is adjustable so as to allow for constructive interference at a position where a recovery unit (RU) is located. The RU may utilize various means of power recovery, such as rectennas to collect the RF energy. For the power transmission process to be performed efficiently, the RU is ideally suited to receive and recover the RF power from different directions and orientations. Furthermore, the RU charging a mobile device (e.g., a phone or tablet) should be compatible with other wireless standards with which the mobile device complies.

An RU, in accordance with one embodiment of the present invention, may be adapted to provide power to a mobile or wireless device in a number of ways. An RU may be incorporated in the wireless device. Alternatively, an RU may be present in an accessory/appendage to the wireless device, or in a retrofitting device (such as a case/cover that secures/protects and charges the wireless device), or in a separate device externally attached to the wireless device.

In accordance with one embodiment of the present invention, the relatively large surface area of a device, or accessory, or appendage, or cover/case, and the like, of an RU provides a relatively large effective electromagnetic aperture along certain directions and orientations than others. However, to maximize power transfer, it is desirable to be able to increase and enhance the effective aperture in other orientations (for instant, when the RU is looking at the GU along the RU's edge) or under different use scenarios.

Embodiments of the present invention provide a more versatile and effective recovery aperture in the RU. In accordance with one exemplary embodiment, an RU, such as a case/protective cover for a portable or wireless device, is adapted to recover the transmitter RF energy in various orientations using an array of antennas each coupled to a high frequency rectifying element. The antennas and the rectifying elements may be positioned in the exterior and/or the interior of the RU. The output power of such rectifying elements are combined, for example, in a low frequency (e.g., DC) domain to charge the wireless device. In accordance with one embodiment of the present invention, a planar array of antennas may be formed on an external surface or periphery of the RU.

Figure 1:
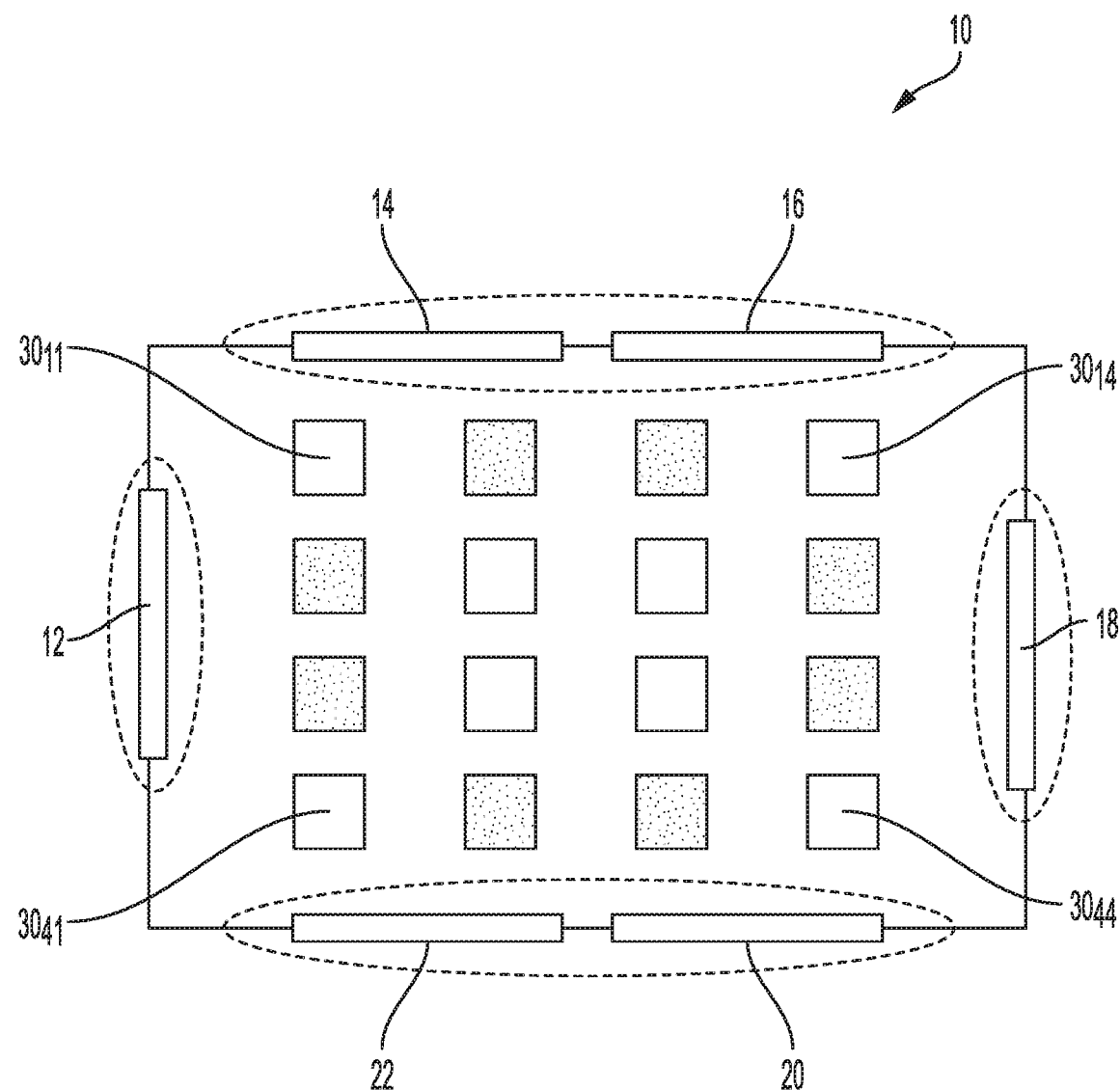
FIG. 1 shows a multitude of antennas of a recovery unit, in accordance with one embodiment of the present invention.

FIG. 1 shows a multitude of antennas formed in a recovery unit 10, assumed to be a protective case/cover in this example, adapted to receive a wireless device in accordance with one embodiment of the present invention. Case 10 is shown as including, in part, antennas 12, 14, 16, 18, 20, 22 positioned along the outer edges of case 10. Case 10 is also shown as including, in part, a 4×4 array of antennas, namely antennas $30_{11} \ldots 30_{14} \ldots 30_{41} \ldots 30_{44}$, positioned on the bottom surface of the case.

Figure 2A:
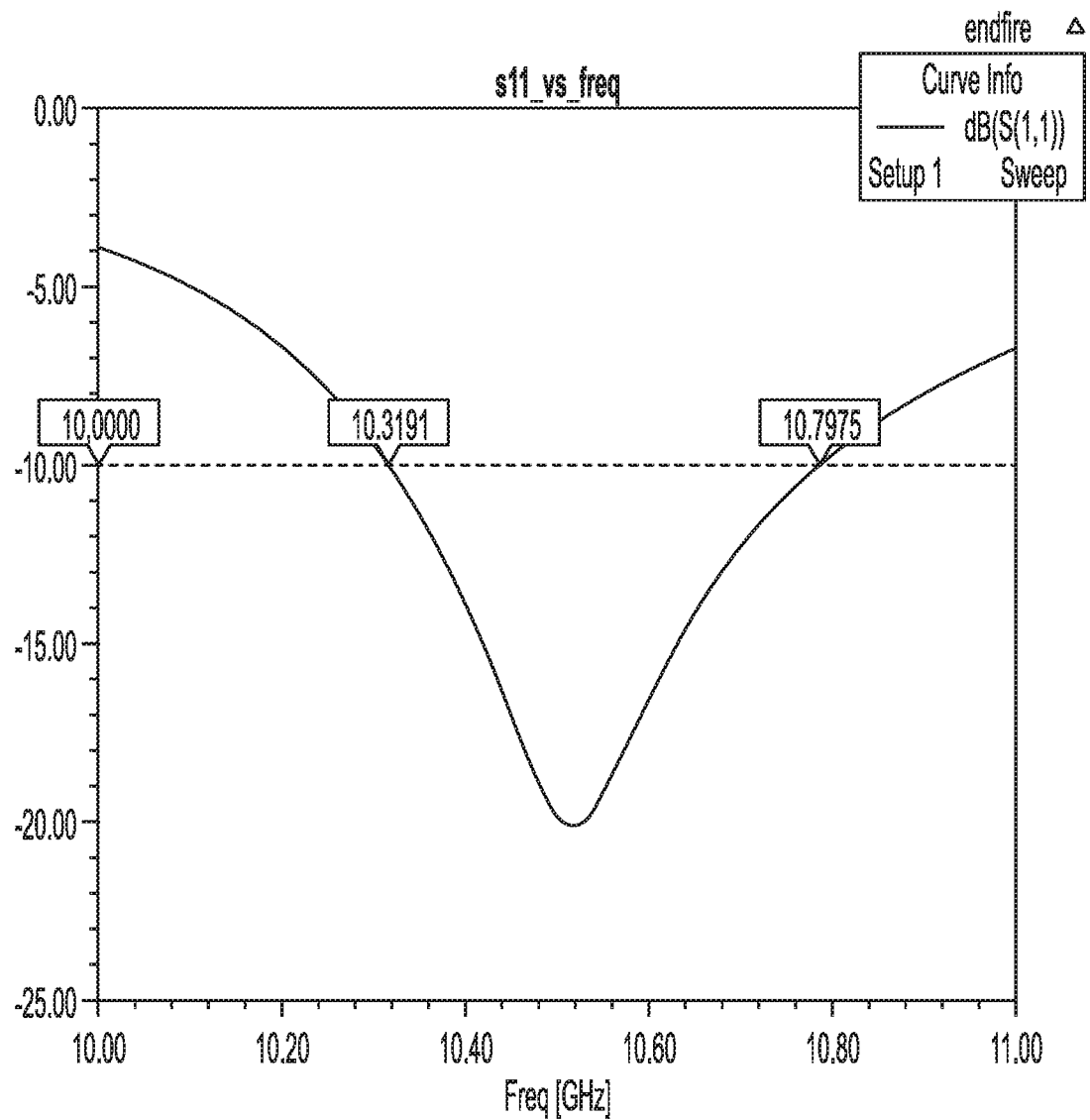
FIGS. 2A and 2B respectively show a frequency response and a Smith chart associated with edge-coupled antennas of the recovery unit of FIG. 1.
Figure 2B:
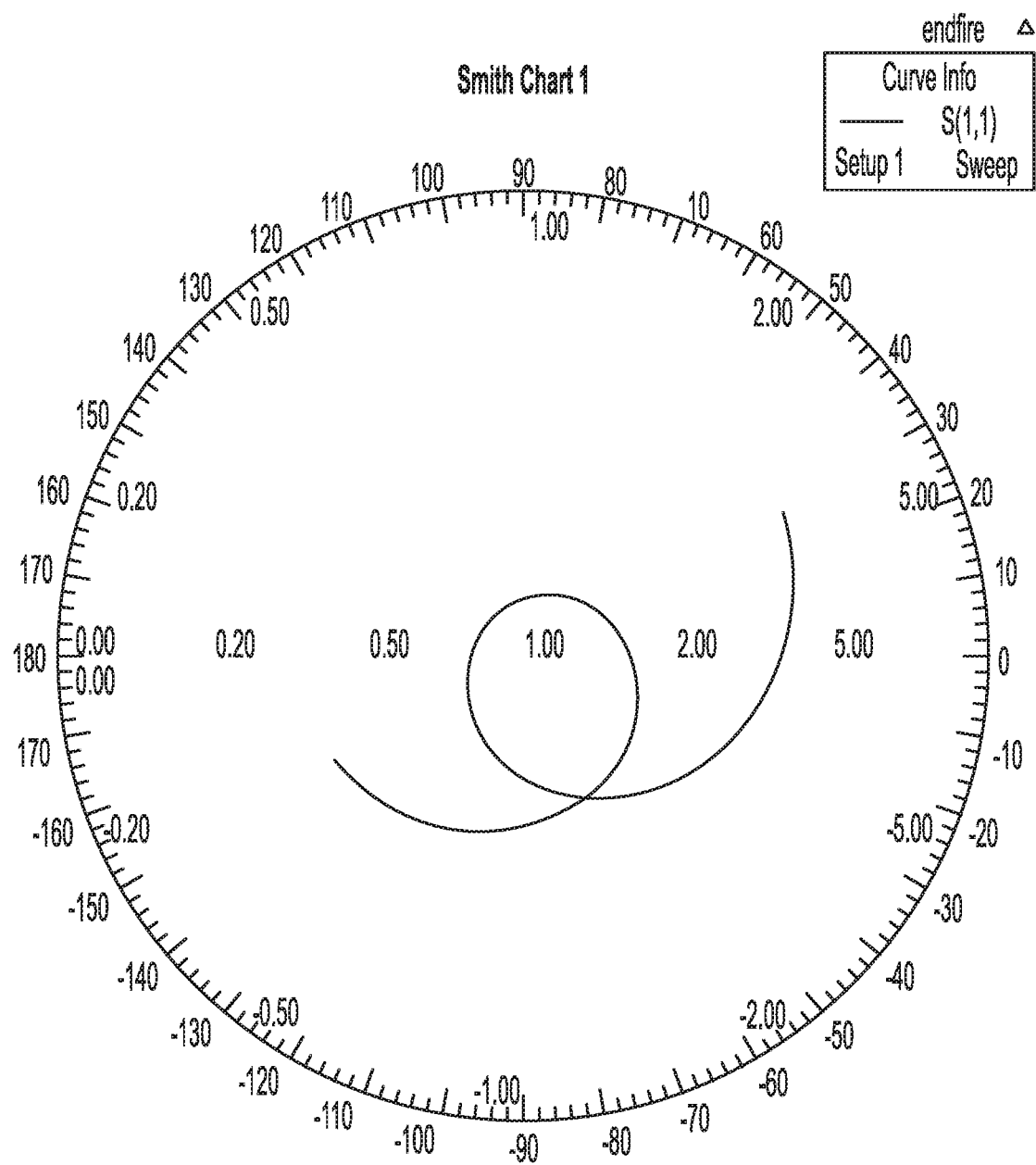
Figure 3A:
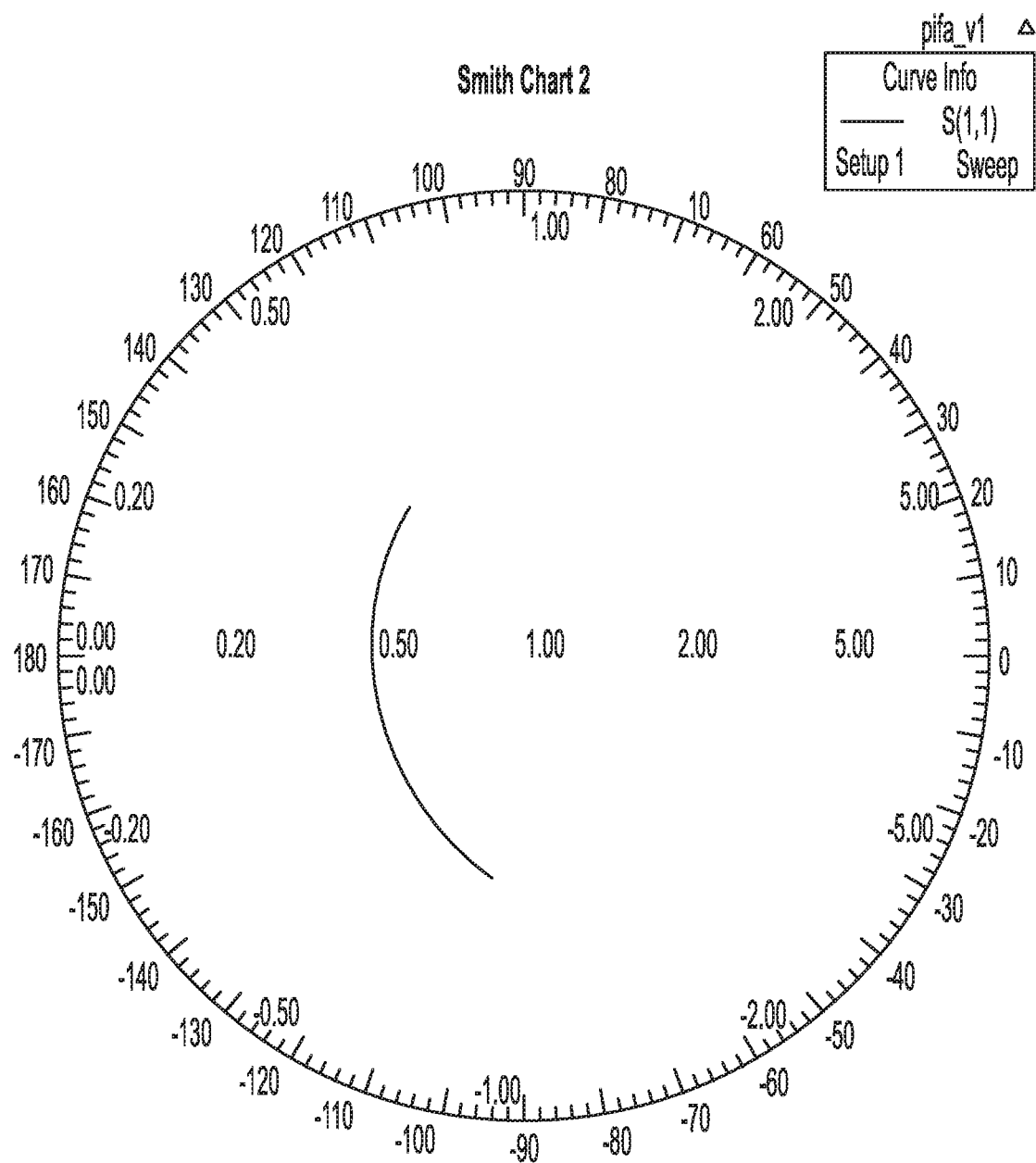
FIGS. 3A and 3B respectively show a Smith chart and a radiation pattern associated with printed antenna of the recovery unit shown in FIG. 1.
Figure 3B:
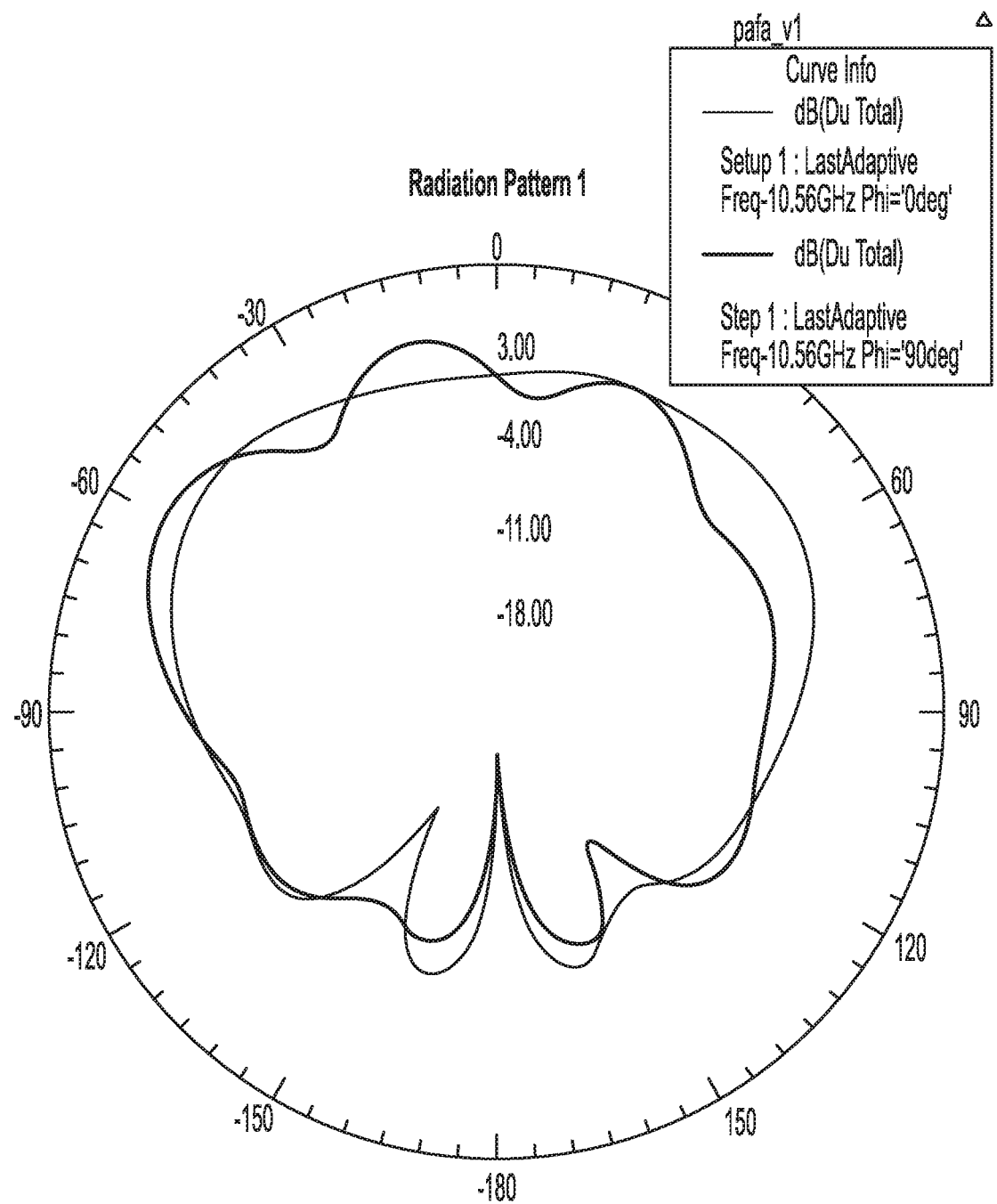
Figure 4A:
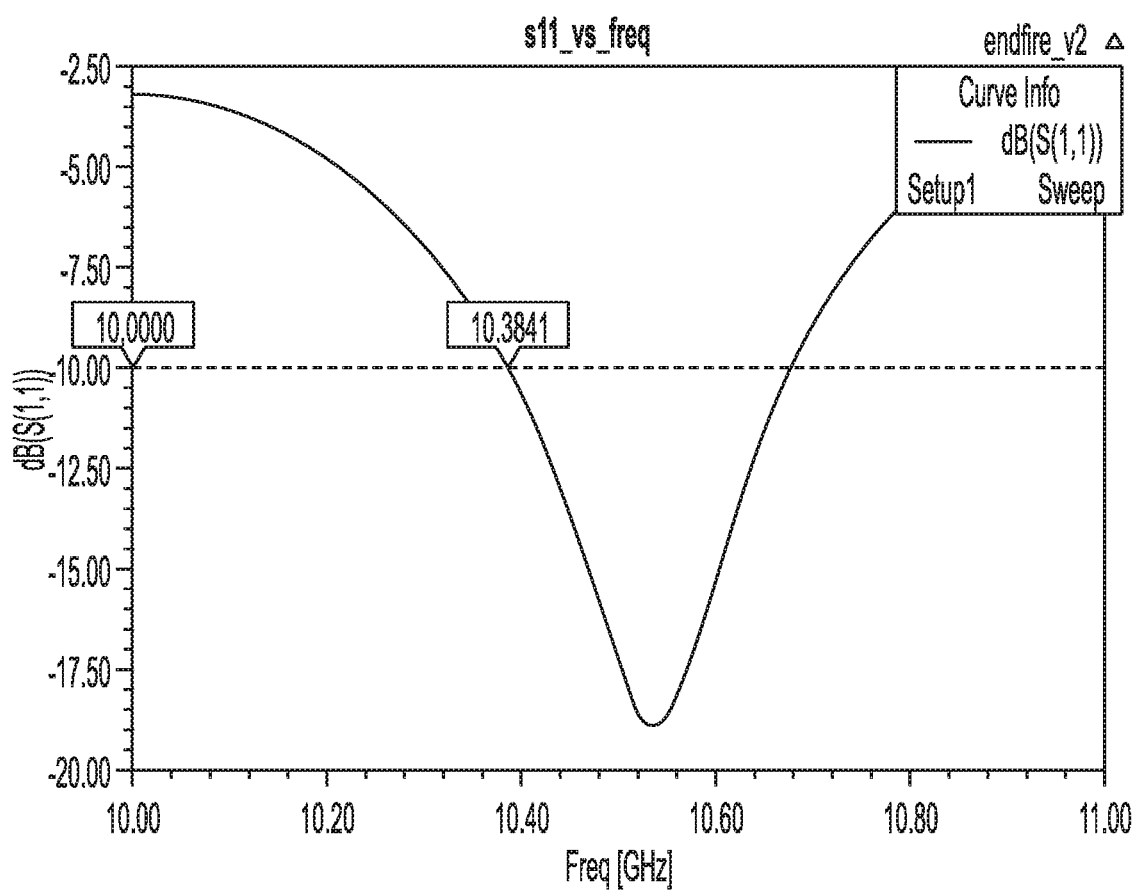
FIGS. 4A and 4B respectively show a frequency response characteristics and radiation pattern associated with End-Fire printed inverted F-antenna (PIFA) of the recovery unit shown in FIG. 1.
Figure 4B:
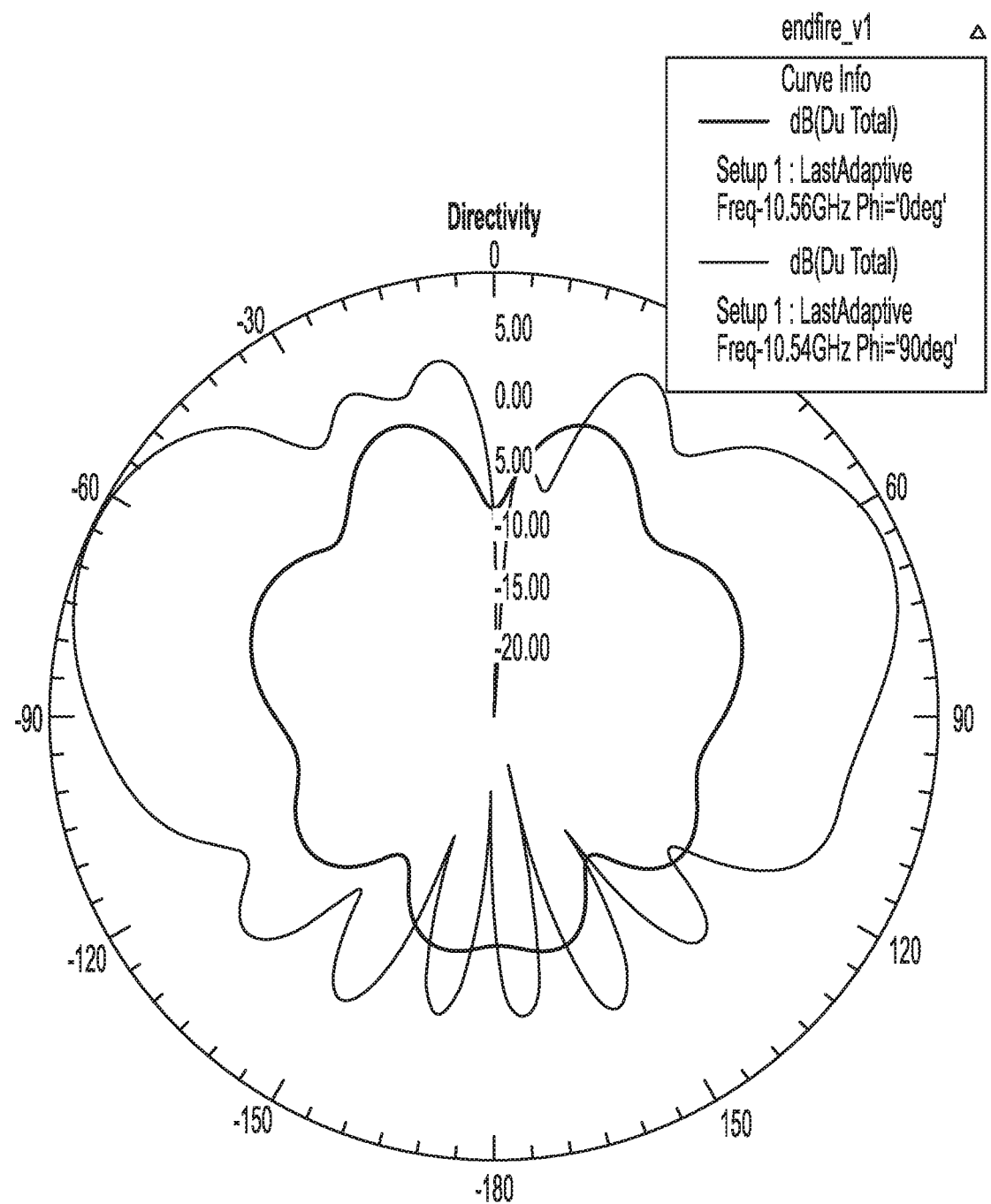

In one exemplary embodiment, each antenna 12, 14, 16, 18, 20, 22 may be an edge coupled antenna having a frequency response characteristics at its associated S11 port as shown in FIG. 2A, and a Smith chart as shown in FIG. 2B. In another embodiment, each antenna 12, 14, 16, 18, 20, 22 may be a printed antenna having a Smith chart at its associated S11 port as shown in FIG. 3A, and a radiation pattern as shown in FIG. 3B. In yet another embodiment, each antenna 12, 14, 16, 18, 20, 22 may be an End-Fire printed inverted F-antenna (PIFA) formed on a negative permittivity substrate having exemplary port S11 frequency response characteristics and radiation pattern as shown respectively in FIGS. 4A and 4B. In some embodiments, antennas positioned along the sides or edges of a case/cover may be placed at an angle that may or may not be at 90° relative to the top or bottom surface of the case.

Figure 5A:
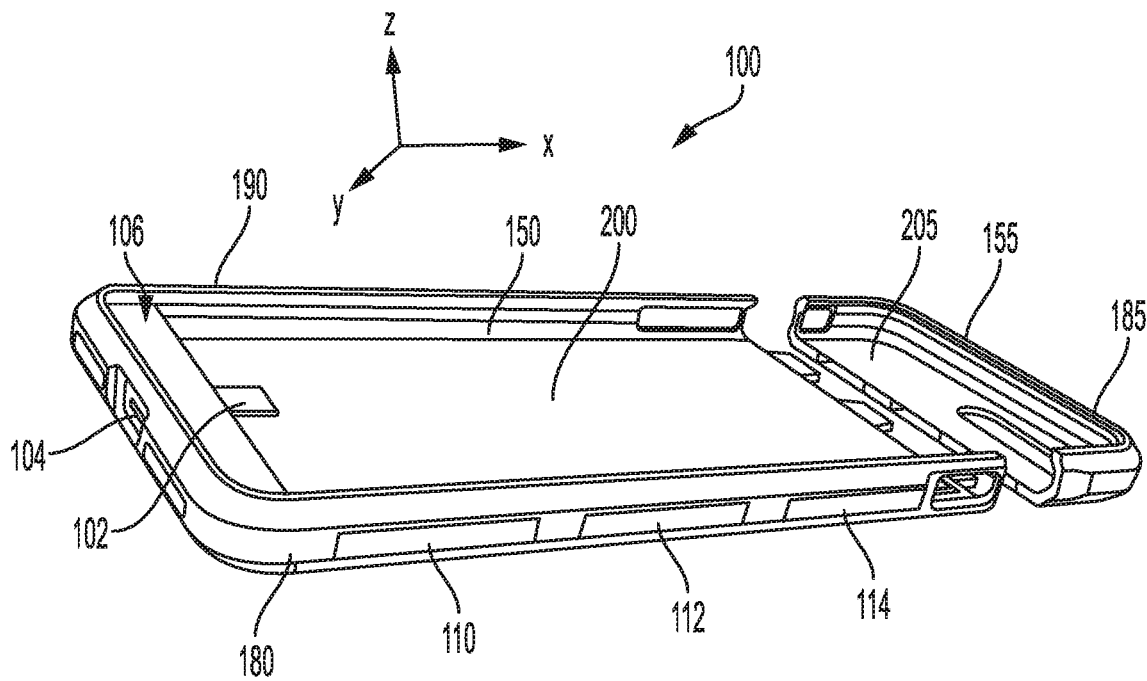
FIGS. 5A and 5B are perspective views of a recovery unit, in accordance with one exemplary embodiment of the present invention.

The following description of the embodiments of the present invention are provided with reference to RUs that are assumed to be cases and/or covers adapted to receive a mobile device. Such cases and or covers may further secure and protect the mobile device. It is understood however that an RU, in accordance with embodiments of the present invention, may include any other accessory and/or appendage external to the mobile device. FIG. 5A is a perspective view of an RU 100 adapted to receive and charge a mobile device when the mobile device is placed therein, in accordance with one exemplary embodiment of the present invention. RU 100, which is shown as being a case or cover, is shown as including, in part, a port 104 which may be, for example, a USB port, a housing module (referred to herein alternatively as module) 106 adapted to house a number of electronic circuits such as control circuits, energy storage medium, sensors, communication circuits, and the like, as well as micro electro-mechanical devices (MEMES) such as gyroscopes, accelerometers, magnetometers and the like.

Case (also referred to herein as cover) 100 is also shown as including a connector 102 (adapted to be inserted into a port of the mobile device) and a number of edge antennas, three of which namely antennas 110, 112 and 114 are shown in this Figure. The edge antennas are placed along the exterior of the upwardly extending side 180 (also referred to herein as edge) of case 100. A mobile device placed in case 100 may communicate with other devices wirelessly or via the control and/or communication circuits disposed in housing module 106. Exemplary case 100 is shown as including two parts 150 and 155 that are mated together to facilitate the positioning and placement of the mobile device therein. In other embodiment, case 200 may be formed from one continuous part.

Figure 5B:
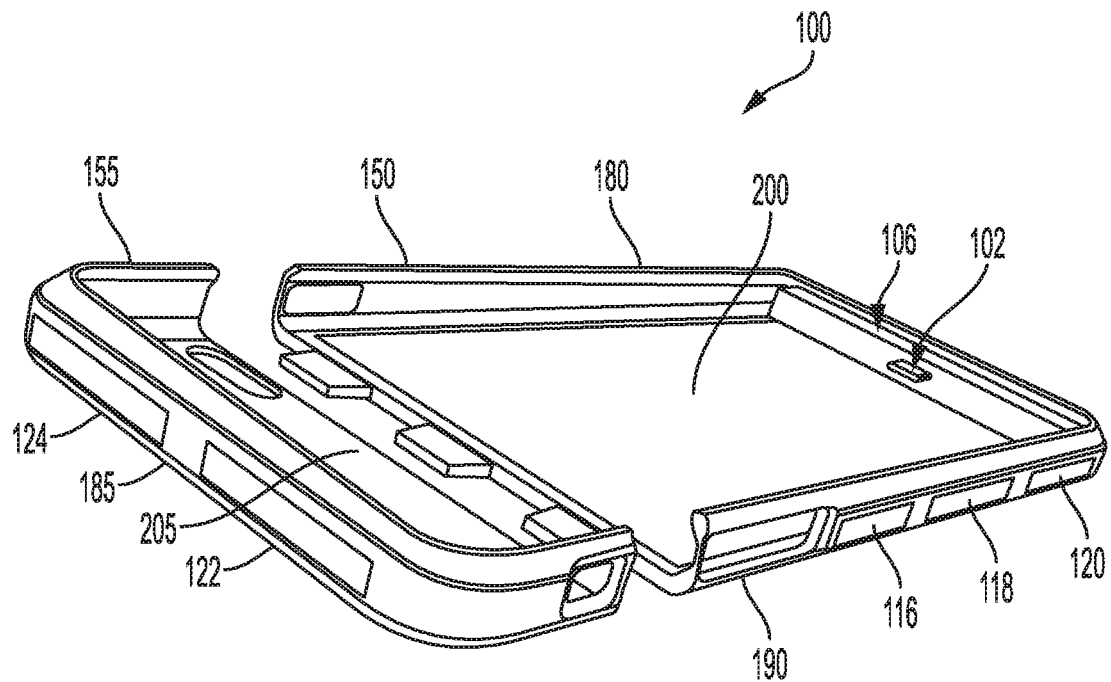

FIG. 5B is a perspective view of case 100 of FIG. 5A after a rotation about the z-axis. As is seen from FIG. 5B, case 100 also includes edge antennas 122, 124 positioned along edge 185, as well as edge antennas 116, 118 and 120 positioned along edge 190 of case 100. Antennas 110, 112, 114, 116, 118, 120, 122, 124 provide a large aperture when viewed along the edges of the cover. Such antennas may be formed in the body of the case directly, or may be formed as a part of a flexible substrate. The antennas may be coupled to a rectifying circuit either locally or via transmission lines. In one embodiment, the antennas together with the rectifying circuit may be integrated with an RF matching network to improve the overall recovery and efficiency of the antenna system.

Figure 6A:
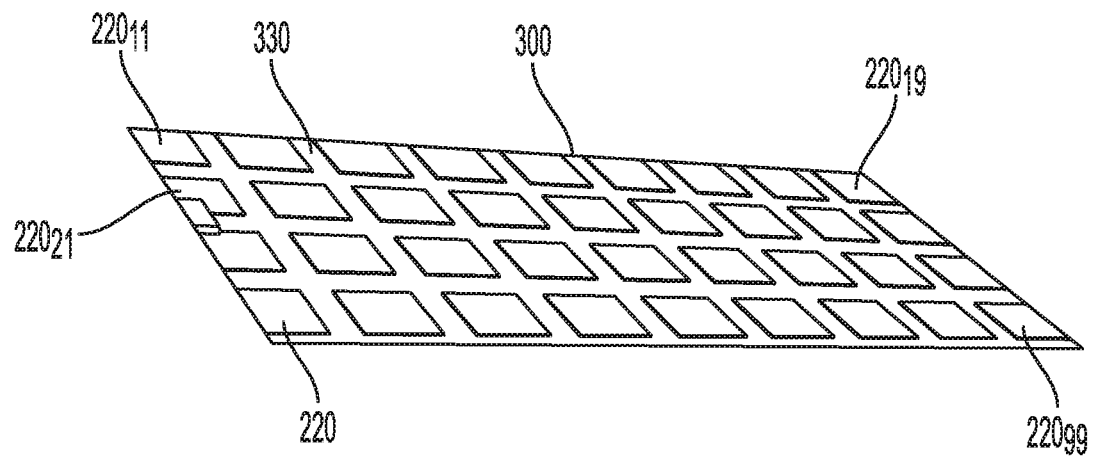
FIGS. 6A and 6B are perspective views of boards positioned on the bottom surface of the recovery unit of FIGS. 5A and 5B, in accordance with one exemplary embodiment of the present invention.

Referring to FIGS. 5A, 5B and 6A concurrently, positioned on the bottom surface 300 (the surface opposing front surface 200 shown in FIGS. 5A and 5B) of case 100, as well as on the bottom surface 305 (the surface opposing front surface 205 shown in FIGS. 5A and 5B), of case 100 are a multitude of planar antennas 220 adapted to further increase the effective electromagnetic aperture of the case 100. Bottom surface 300 which is exposed to electromagnetic radiation when the case is placed upside down, is shown as including a 4×9 array of planar antennas $220_{ij}$ formed on board 330, where i is a row index varying from 1 to 4 and j is a column index varying from 1 to 9 in this exemplary embodiment. Board 330 may be an RF board, and although not shown, may include, associated with each antenna or a group of antennas, circuitry for rectifying the received RF signal, impedance matching circuitry, voltage regulator, amplifier and the like.

Figure 6B:
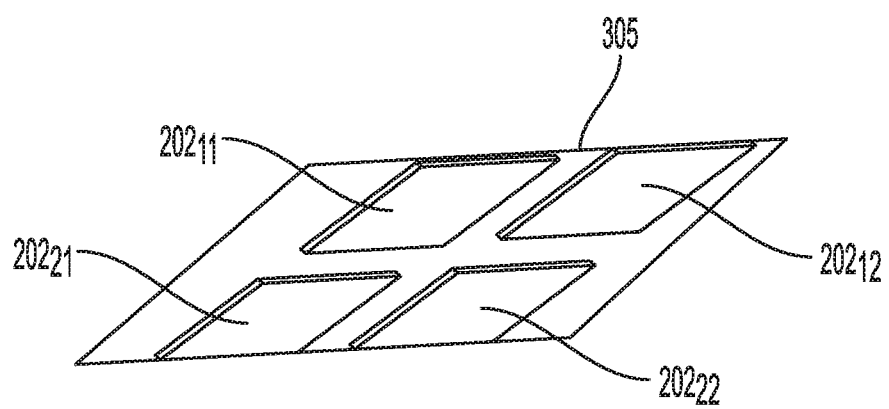

Referring to FIG. 6B, bottom surface 305 which is also exposed to electromagnetic radiation when the case is placed upside down, is shown as including a 2×2 array of planar antennas $220_{k1}$ where k is a row index varying from 1 to 4 and 1 is a column index varying from 1 to 2 in this exemplary embodiment.

Figure 7A:
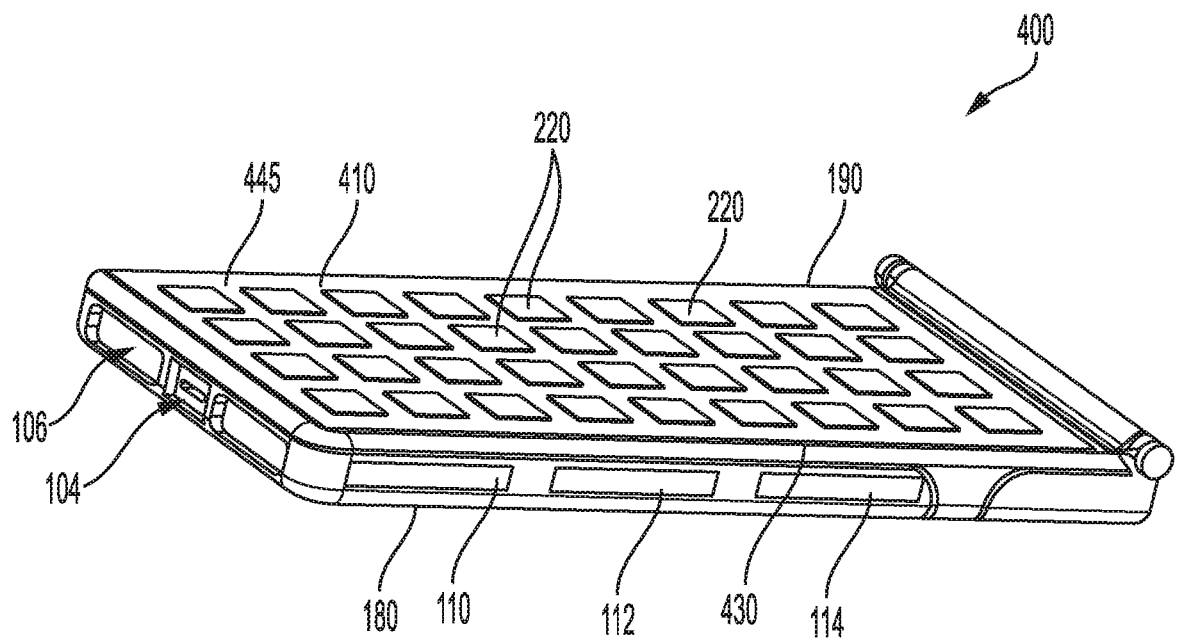
FIGS. 7A and 7B are perspective views of a recovery unit, in accordance with one exemplary embodiment of the present invention.
Figure 7B:
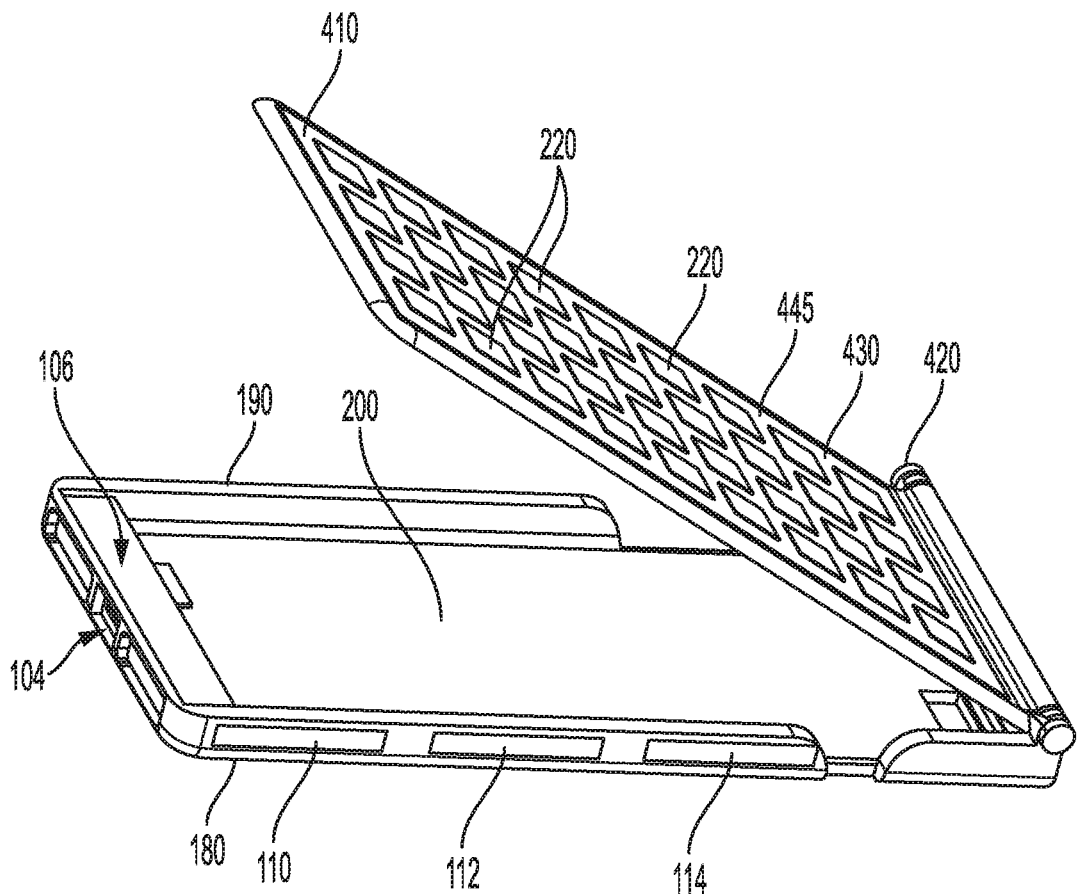

FIGS. 7A and 7B are perspective views of a case (RU) 400 adapted to receive and charge a mobile device when the mobile device is placed therein, in accordance with one exemplary embodiment of the present invention. Case 400 is similar to case 100 except that case 400 includes lid 410 adapted to swivel around member 420 to open and close the case. FIG. 7B shows case 400 when the lid is partially open and FIG. 7A shows case 400 when the lid is closed.

Positioned along edge 180 of case 400 are edge antennas 110, 112 and 114. Although not shown in FIGS. 7A and 7B, a number of edge antennas are also present along edge 190 of case 400. The top surface of lid 410 is shown as including a 4×9 array of planar antennas $220_{ij}$, formed on board 430, where i is a row index varying from 1 to 4 and j is a column index varying from 1 to 9 in this exemplary embodiment. Board 430 is an RF board and although not shown, may include, associated with each antenna or a group of antennas, circuitry for rectifying the received RF signal, impedance matching circuitry, voltage regulator, amplifier and the like. Antennas $220_{ij}$ thus further increase the effective electromagnetic aperture of case 100.

In some embodiments, the bottom surface of case 400 (i.e., the surface opposing surface 200 on which mobile device rests) may also include an array of planar antennas in a manner similar to that shown in FIG. 6A. Case 400 is also shown as including housing module 106 and port 104 in a manner similar to that shown in FIG. 5A.

Figure 7C:
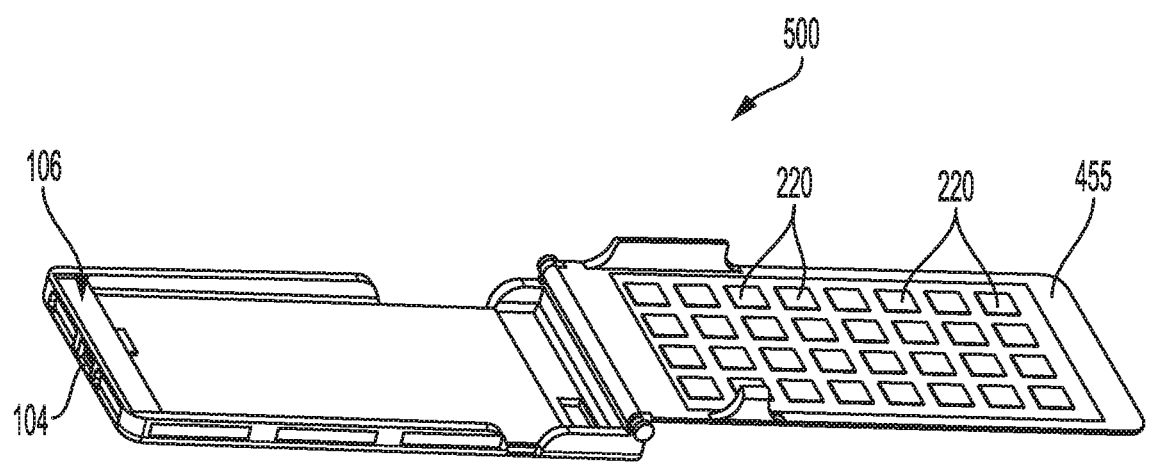
FIG. 7C is a perspective views of a recovery unit, in accordance with one exemplary embodiment of the present invention.

FIG. 7C is a perspective view of a case (RU) 500 adapted to receive and charge a mobile device when the mobile device is placed therein, in accordance with one exemplary embodiment of the present invention. Case 500 is similar to case 400 except that lid 410 of case 500 includes an array of planar antennas 220 on both its top surface 445, in the manner similar to that shown in FIG. 7A, as well as an array of planar antennas 220 disposed on its bottom surface 455. Therefore, when lid 410 is open, planar antennas 220 disposed on bottom surface 455 increase the case's effective electromagnetic aperture.

Figure 8:
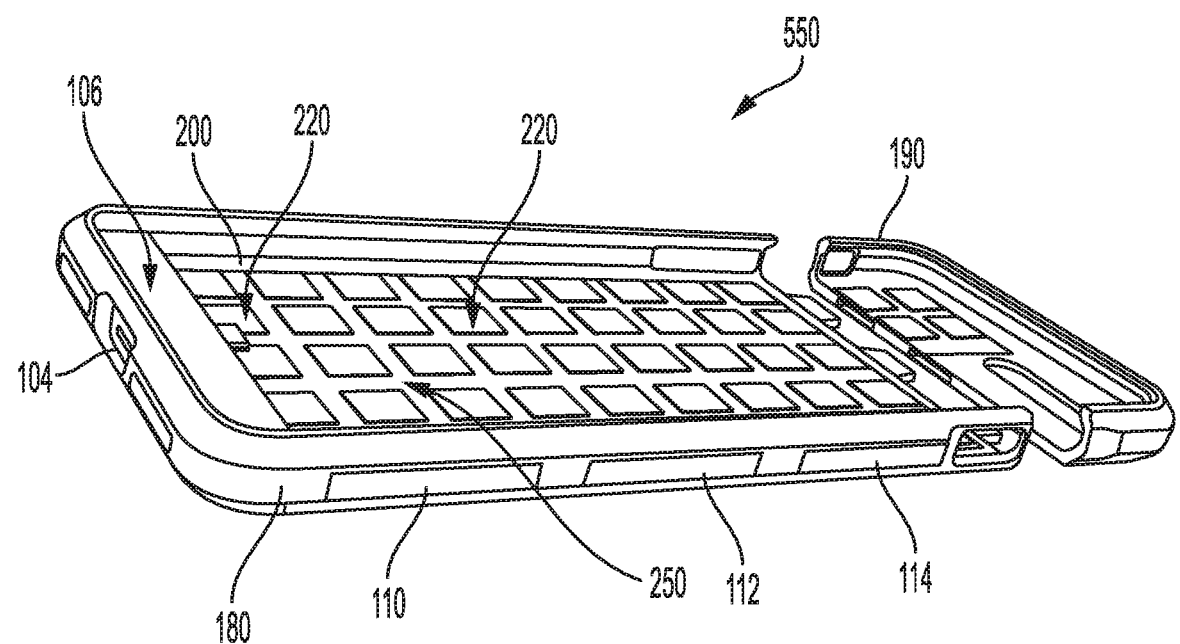
FIG. 8 is a perspective view of a recovery unit, in accordance with one exemplary embodiment of the present invention.

FIG. 8 is a perspective view of a case (RU) 550 adapted to receive and charge a mobile device when the mobile device is placed therein, in accordance with one exemplary embodiment of the present invention. Case 550 is shown as including, in part, a port 104 which may be, for example, a USB port, a housing module 106 adapted to house a number of electronic circuits such as control circuits, energy storage medium such a battery or capacitor, sensors, communication circuits, one or MEMS devices such as gyroscope, accelerometer, magnetometer and the like. Case 500 is also shown as including a connector 102 adapted to be inserted into a port of the mobile device, and a number of edge antennas, three of which namely antennas 110, 112 and 114 are shown in this exemplary embodiment along edge 180 of the case. The edge antennas increase the effective electromagnetic aperture of the case.

Board 250, disposed on the top surface 200 and against which the mobile device rests when placed in the case, is also shown as including a multitude of planar antennas 220. Although not shown in FIG. 8, associated with each antenna or a group of such antennas is a circuit for rectifying the received RF signal, an impedance matching circuit, a voltage regulator, an amplifier, and the like. When a mobile device is not placed in the case thus exposing the planar antennas on board 250, the RF power received by the planar as well as the edge antennas is converted to a DC voltage and stored in an energy storage medium disposed in module 106. The mobile device may then be charged as necessary by the energy storage medium when the mobile device is placed in the case. The bottom surface of case 550 may also include a multitude of planar antennas to charge the energy storage medium or the mobile device when the mobile device is placed in the case, as described above with reference to FIG. 5A.

Figure 9:
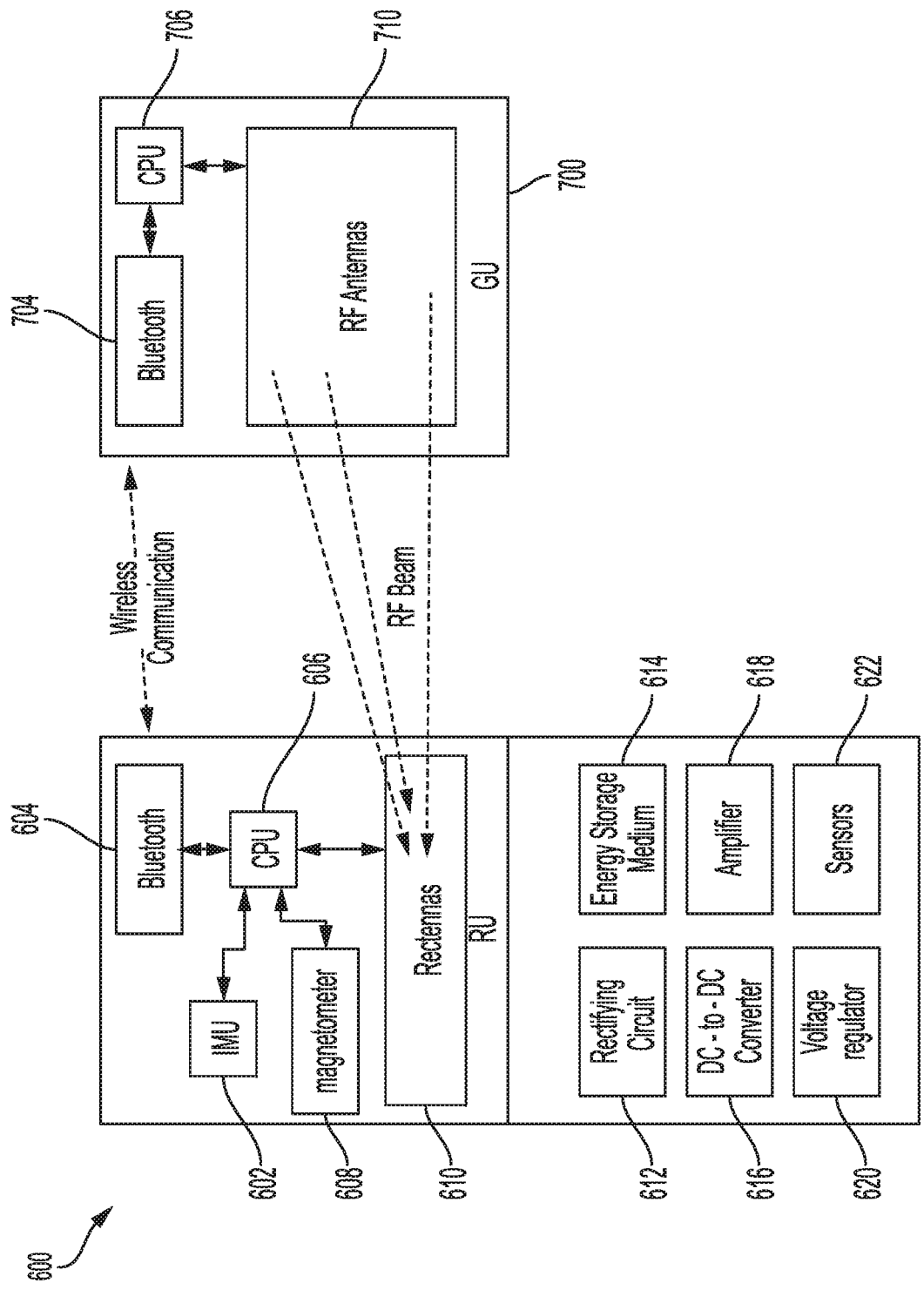
FIG. 9 shows a number of electronic circuits, storage unit, sensors and micro electro-mechanical devices disposed in a recovery unit, in accordance with one exemplary embodiment of the present invention.

Housing module 106 and/or the printed circuit boards used in any of the embodiments described above (e.g., board 330, or 430) may include a number of electronics or electro-mechanical systems. FIG. 9 shows an RU 600 being charged wirelessly by a GU 700. It is understood that RU 600 may be disposed in a wireless device, in a case/cover as described in reference to any of the embodiments herein, or in an accessory that may be plugged into the wireless device via a port, such as port 104 shown in FIG. 5A, and the like. Exemplary embodiment of RU 600 is shown as including, in part, a number of receive antennas (rectennas) 610, a wireless communication circuit, such as Bluetooth/WiFi/Zigbee/Thread/LoRa 604 adapted to communicate wirelessly with GU 700, a processing unit (CPU) 606, a rectifying circuit 612 adapted to convert the RF power received from GU 700 to a DC voltage, one or more sensors 622, a DC-to-DC converter 616, an inertial measurement unit (IMU) 602, a magnetometer 608, a voltage regulator 620, an amplifier 618, and an energy storage medium 614. Exemplary embodiment of GU 700 is shown as including, in part, a number of transmit antennas 710, a wireless communication circuit, such as Bluetooth/WiFi/Zigbee/Thread/LoRa 704 adapted to communicate wirelessly with RU 600, and a processing unit 706.

IMU 602 may be a 9-axis IMU that includes, in part, an accelerometer, and gyroscope. Sensor 622 may include circuitry to sense environmental conditions, such as barometric pressure, humidity, and temperature. The barometric pressure sensor is adapted to determine the altitude of RU 600 which is then transmitted to GU 700 via the wireless communication link (e.g., Bluetooth) to, for example, facilitate the process of phase tuning or adjustments of the multitude of antennas 710. In a similar manner, the humidity and temperature sensors provide a more accurate measure of the environmental conditions at RU 600 which are then transmitted to GU 700 for further modification and adjustment of the phases of the transmit antennas.

Figure 10A:
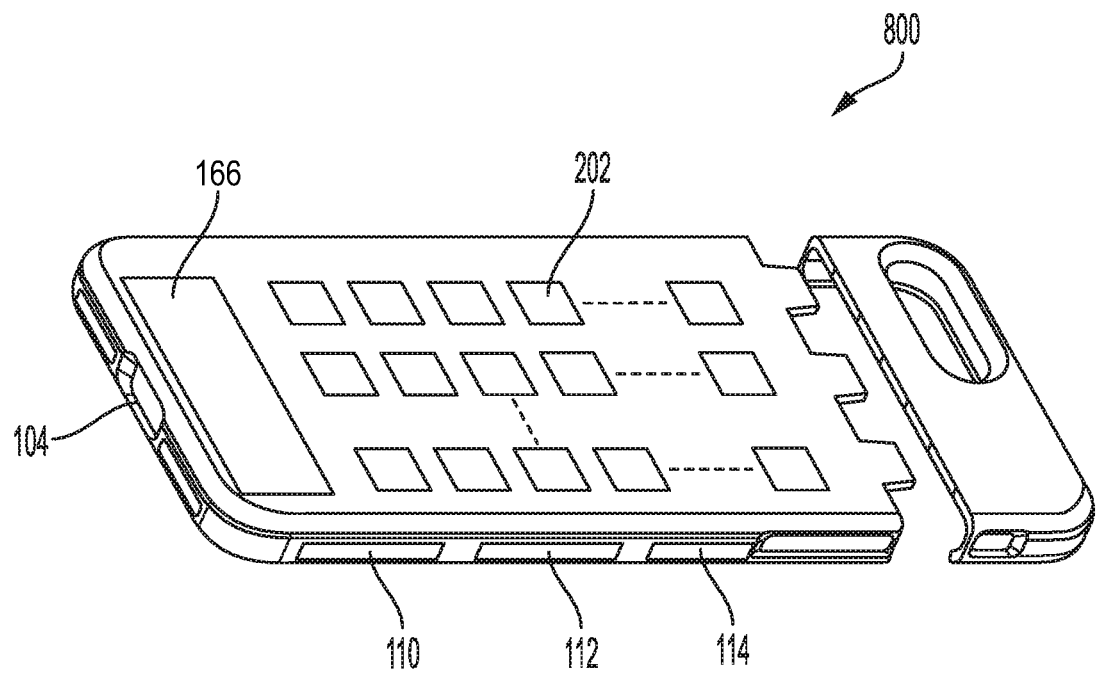
FIG. 10A is a perspective views of a recovery unit, in accordance with one exemplary embodiment of the present invention.

Some embodiments of an RU include an indicator and associated circuitry for providing information such as the charging status, as well as other messages to the user. The indicators may provide such data visually, through audio, haptics (for example, vibration), and any other sensory output. FIG. 10A is an exemplary embodiment of a case (RU) 800 that is similar to RU 100 shown in FIG. 5A except that case 800 includes a display 166 for displaying information such as the charging status, proximity to the GU, rate of power charge, alignment of the RU, phone messages, weather information, time, and the like. Accordingly, the user can receive such information in an intuitive, easy-to-grasp setting without the need to flip the device, open the case, or turn the phone on. In another exemplary embodiment, such information can be conveyed using several LEDs where the information may be represented by the number of LEDs that have been turned on, or their color, or blinking status. In addition to charging via RF signals, an RU, in accordance with embodiments of the present invention, may include a coil/inductor and associated circuitry to work with near-field inductive charging standards.

Figure 10B:
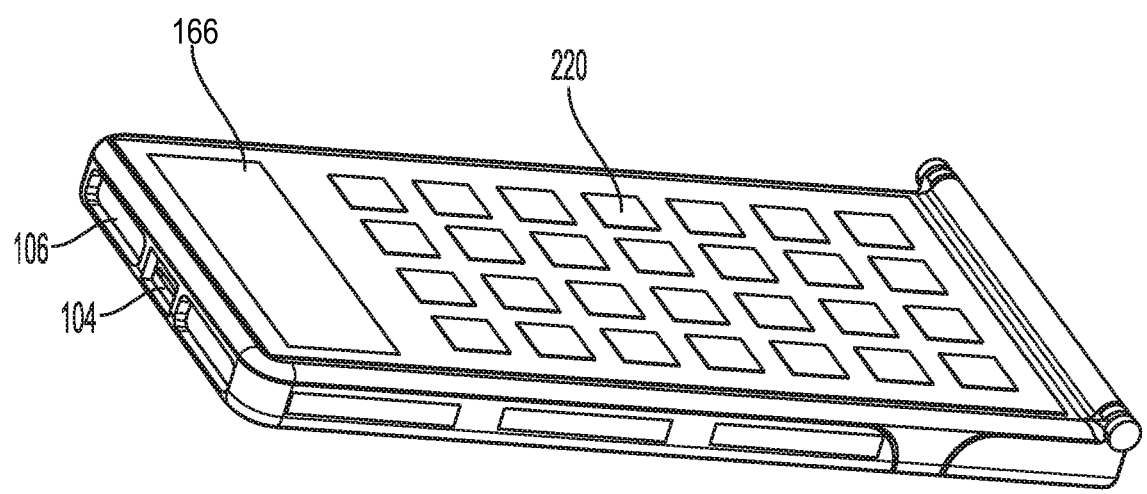
FIG. 10B is a perspective views of a recovery unit, in accordance with one exemplary embodiment of the present invention.

FIG. 10B is an exemplary embodiment of a case (RU) 850 that includes a visual display. Case 850 is similar to RU 400 shown in FIG. 7B except that case 850 includes a display 166 for displaying information such as the state of the charge (charging status), proximity to the GU, rate of power charge, alignment of the RU, and the like.

Figure 11:
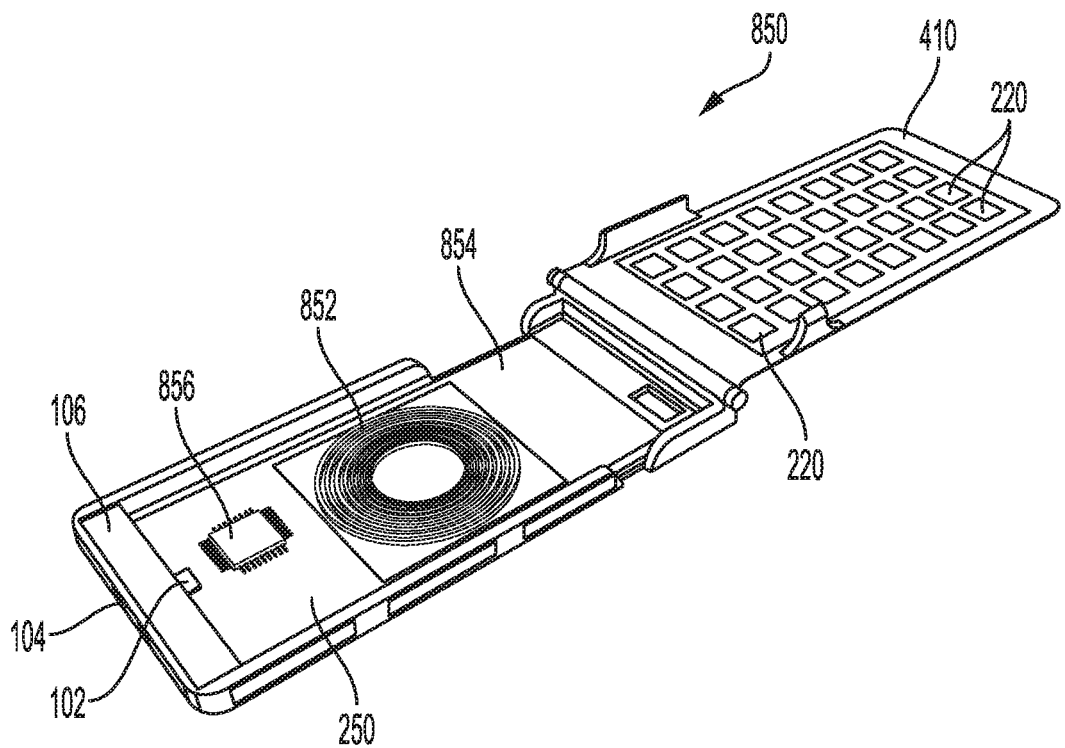
FIG. 11 is a perspective view of a recovery unit, in accordance with one exemplary embodiment of the present invention.

FIG. 11 is a perspective view of a case (RU) 850 adapted to receive and charge a mobile device when the mobile device is placed therein, in accordance with one exemplary embodiment of the present invention. Case 850 is similar to RU 500 shown in FIG. 7C, except that case 850 also includes, in part, an energy storage unit 854, and a coil (inductive) 852. The RF power received by antennas 220 is converted by the electronic circuitry disposed in module 106 to DC voltage, as described above, to charge the mobile device or the energy storage unit/medium also disposed in module 106. The RF power received by antennas 220 is further converted to an AC voltage, either by the circuitry disposed on board 250 (such as by integrated circuit 856) or by the circuity disposed in module 106, and applied to coil 852. The AC voltage applied to coil 852 creates a time-varying magnetic flux which is received by a second coil (not shown) disposed in the mobile device. The coil in the mobile device converts the magnetic flux to an AC voltage which is subsequently rectified and optionally filtered to supply a DC voltage. The DC voltage so supplied is used to either charge (i) the mobile device or (ii) the energy storage unit 854 also present on board 250, or (iii) the energy storage unit disposed in module 106. The energy storage unit may be a battery, a capacitor, or the like.

Figure 12:
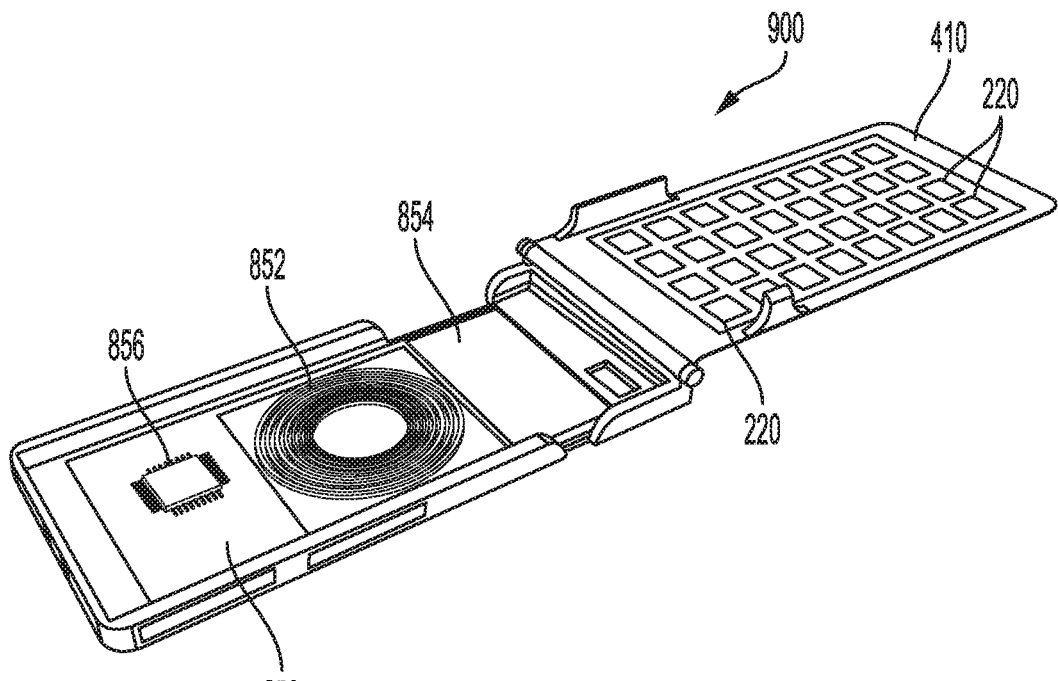
FIG. 12 is a perspective view of a recovery unit, in accordance with one exemplary embodiment of the present invention.

FIG. 12 is a perspective view of a case (RU) 900 adapted to receive and charge a mobile device when the mobile device is placed therein, in accordance with one exemplary embodiment of the present invention. Case 900 is similar to case 850 shown in FIG. 11, except that case 900 does not include module 106. Accordingly, in embodiment 900, all electronic circuits, sensors and electro-mechanical system shown in FIG. 9 are present on board 250, one of which, namely integrated circuit 856 is shown in FIG. 12.

Figure 13:
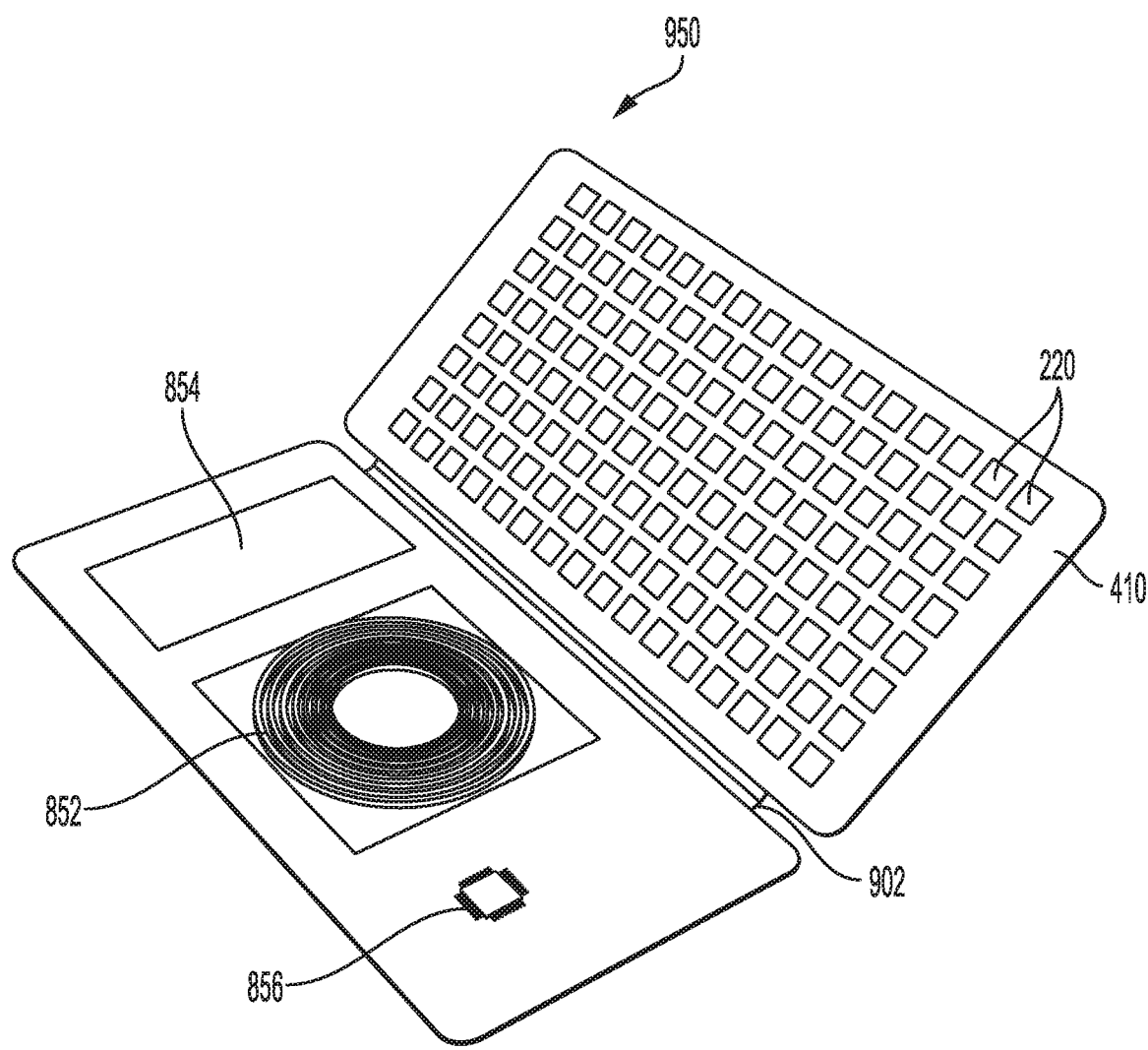
FIG. 13 is a perspective view of a recovery unit, in accordance with one exemplary embodiment of the present invention.

FIG. 13 is a perspective view of a case 950 adapted to receive and charge a mobile device when the mobile device is placed therein, in accordance with one exemplary embodiment of the present invention. Case 950 is similar to case 900 shown in FIG. 11, except that in case 990 lid 410 swivels around the long axis 902. Lid 410 is shown as including an 8×16 array of planar antenna 220, transmitting coil 852, integrated circuit 856 and an energy storage unit 854.

The above embodiments of the present invention are illustrative and not limitative. Embodiments of the present invention are not limited by the type of device that may be wirelessly charged. Other additions, subtractions or modifications are obvious in view of the present disclosure and are intended to fall within the scope of the appended claims.

What is claimed is:

1. A recovery unit for receiving a mobile device, the recovery unit comprising:
    a first plurality of planar antennas for receiving a plurality of radiating radio frequency (RF) signals and disposed along at least one of bottom or top surfaces of the recovery unit;
    a rectifying circuit for converting a power of the plurality of radiating RF signals received by the first plurality of planar antennas to a DC power;
    an energy storage unit for storing the DC power; and
    a wireless communication circuit for communicating with a power generating unit generating the plurality of RF signals, wherein the recovery unit supplies the DC power to the mobile device when the mobile device is placed therein, wherein said recovery unit further comprises a lid adapted to swivel around an end axis of the recovery unit thereby to open and close the recovery unit, wherein said lid comprises a second plurality of planar antennas positioned along a top surface thereof and adapted to receive the plurality of radiating RF signals, and wherein said lid is not transparent and comprises a third plurality of planar antennas positioned along a bottom surface thereof, opposing the top surface, and adapted to receive the plurality of RF signals, wherein the third plurality of antennas is exposed when the lid is open.

2. The recovery unit of claim 1 wherein the rectifying circuit is disposed on a board on which the first plurality of planar antennas are disposed.

3. The recovery unit of claim 1 further comprising a first plurality of edge antennas for receiving the plurality of RF signals and disposed along exterior edges of the recovery unit.

4. The recovery unit of claim 1 wherein said recovery unit further comprises a second plurality of planar antennas disposed along both top and bottom surfaces of the recovery unit.

5. The recovery unit of claim 1 wherein said wireless communication circuit further communicates with the mobile device via a wireless or wired link.

6. The recovery unit of claim 1 wherein said recovery unit further comprises:
    an inertia measurement unit;
    a magnetometer; and
    a processor for processing data received from the wireless communication circuit, the inertia measurement unit and the magnetometer.

7. The recovery unit of claim 6 wherein said processor further processes data received from the gyroscope.

8. The recovery unit of claim 1 further comprising at least one inductive coil adapted to supply or receive power from the mobile device.

9. The recovery unit of claim 1 further comprising at least one inductive coil, wherein said recovery unit is further adapted to supply power to the mobile device when applying an AC power to the inductive coil, said AC power being generated from the received RF power.

10. The recovery unit of claim 1 further comprising at least one inductive coil, wherein said recovery unit is further adapted to supply power to the mobile device from the energy storage unit when an AC power is applied to the inductive coil.

11. The recovery unit of claim 1 wherein said recovery unit further comprises a display.

12. The recovery unit of claim 1 wherein said recovery unit further comprises an accelerometer for measuring acceleration.

13. The recovery unit of claim 12 wherein said recovery unit further comprises a gyroscope for measuring orientation and angular velocity.

14. The recovery unit of claim 1 further comprising a DC-to-DC converter.

15. The recovery unit of claim 1 further comprising a voltage regulator.

16. The recovery unit of claim 1 wherein the rectifying circuit is disposed in a module comprising a port for communication with the mobile device.

17. The recovery unit of claim 1 wherein said first plurality of planar antennas form an array.

18. The recovery unit of claim 17 wherein said array is a two-dimensional array.

19. The recovery unit of claim 1 further comprising a barometer.

20. The recovery unit of claim 19 further comprising a temperature sensor.

21. The recovery unit of claim 20 further comprising a humidity sensor.

22. The recovery unit of claim 21 further comprising an amplifier.

23. The recovery unit of claim 22 wherein said recovery unit provides information about elevation, temperature and humidity to the power generating unit via the wireless communication circuit.

* * * * *